(12) United States Patent
Lee et al.

(10) Patent No.: US 7,639,086 B2
(45) Date of Patent: Dec. 29, 2009

(54) THERMOMETER CODE GENERATOR, AND FREQUENCY-LOCKED LOOP INCLUDING THE SAME

(75) Inventors: In-Ho Lee, Anyang-si (KR); Seok-Soo Yoon, Suwon-si (KR); Young-Ho Kwak, Seoul (KR); Ki-Hong Kim, Hwaseong-si (KR); Chulwoo Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 293 days.

(21) Appl. No.: 11/892,476

(22) Filed: Aug. 23, 2007

(65) Prior Publication Data
US 2008/0048904 A1 Feb. 28, 2008

(30) Foreign Application Priority Data
Aug. 26, 2006 (KR) .................. 10-2006-0081395

(51) Int. Cl.
*H03M 7/00* (2006.01)
*H03L 7/06* (2006.01)

(52) U.S. Cl. ............ 331/1 A; 341/187; 327/157
(58) Field of Classification Search ............ 331/1 A; 327/167; 341/187
See application file for complete search history.

(56) References Cited

U.S. PATENT DOCUMENTS

| 5,446,867 | A | 8/1995 | Young et al. |
| 6,803,827 | B1 | 10/2004 | Kenney et al. |
| 7,352,297 | B1* | 4/2008 | Rylyakov et al. ............ 341/50 |
| 2005/0017878 | A1* | 1/2005 | Armstrong ............ 341/50 |
| 2005/0117404 | A1 | 6/2005 | Savoj |

* cited by examiner

*Primary Examiner*—Joseph Chang
(74) *Attorney, Agent, or Firm*—Lee & Morse, P.C.

(57) ABSTRACT

A thermometer code generator includes n bit storing stages that are coupled to each other, where n is an integer greater than 1, and the n bit storing stages store a thermometer code, and are adapted to increase the stored thermometer code by 1 in synchronization with a clock signal when an up signal is active, to decrease the stored thermometer code by 1 in synchronization with the clock signal when a down signal is active, and to maintain the stored thermometer code in synchronization with the clock signal when both of the up signal and the down signal are inactive.

20 Claims, 10 Drawing Sheets

THERMOMETER CODE GENERATOR, AND FREQUENCY-LOCKED LOOP INCLUDING THE SAME

BACKGROUND OF THE INVENTION

1. Field of the Invention

Embodiments of the present invention relate to a thermometer code generator and devices employing such a thermometer code generator. More particularly, embodiments of the present invention relate to a simple and/or highly reliable thermometer code generator and devices, e.g., highly reliable frequency-locked loop (FLL) employing such a thermometer code generator.

2. Description of the Related Art

A clock data recovery (CDR) circuit generally employs a clock that has a locked frequency in order to recover a data exactly. A frequency-locked loop (FLL) may include a voltage controlled oscillator (VCO). The FLL may generate a signal that is synchronized to a target frequency, and may output a lock detection signal when a frequency of the signal is locked.

A conventional FLL may employ both fine and course tuning, and may include an up/down counter and decoder. The counter may count a number of up times and a number of down times related to tuning a VCO clock, and the decoder may convert a binary code representing the counted number to a thermometer code. Employing such a decoder may increase time delay, increase complexity of the decoder when a bit number of the counter increases and/or increase an error of the thermometer code when the decoder becomes complicated. As a result of such error in the generated thermometer code, the VCO clock generated by the VCO may not be locked. Also, as current that flows through the VCO may be changed by a first control voltage for fine tuning and a second control voltage for coarse tuning, a duty ratio of the VCO clock may not be 50%.

SUMMARY OF THE INVENTION

Embodiments of the present invention are therefore directed to a thermometer code generator and a frequency locked loop including such a thermometer code generator, which substantially overcome one or more of the problems due to the limitations and disadvantages of the related art.

It is therefore a feature of an embodiment of the present invention to provide a thermometer code generator having a relatively simpler structure.

It is therefore a separate feature of an embodiment of the present invention to provide a thermometer code generator employable by a highly reliable frequency-locked loop (FLL), and such a highly reliable FLL. Such a highly reliable FLL may efficiently lock a VCO clock at a target frequency.

It is therefore a separate feature of an embodiment of the present invention to provide a thermometer code generator employable by a frequency controller that controls an output frequency of a voltage controlled oscillator (VCO).

It is therefore a separate feature of an embodiment of the present invention to provide a VCO frequency controller employing a highly reliable thermometer code generator that may prevent a VCO from generating a VCO clock having a non-intended frequency.

It is therefore a separate feature of an embodiment of the present invention to provide a frequency-locked loop employing a highly reliable thermometer code generator that may efficiently lock a VCO clock to a target frequency.

At least one of the above and other features and advantages of the present invention may be realized by providing a thermometer code generator, including n bit storing stages coupled to each other, where n is an integer greater than 1, and the n bit storing stages are adapted to store a thermometer code, to increase the stored thermometer code by 1 in synchronization with a clock signal when an up signal is active, to decrease the stored thermometer code by 1 in synchronization with the clock signal when a down signal is active, and to maintain the stored thermometer code in synchronization with the clock signal when both of the up signal and the down signal are inactive.

The thermometer code generator may include a maintenance signal generator adapted to generate a maintenance signal that is activated only when both of the up signal and the down signal are inactive, wherein the thermometer code stored in the bit storing stages may be maintained when the maintenance signal is active. The maintenance signal generator may include a first flip-flop adapted to output the up signal in synchronization with the clock signal, a second flip-flop adapted to output the down signal in synchronization with the clock signal, and a logic circuit adapted to receive the up signal and the down signal to output the maintenance signal. The logic circuit may include a NOR gate.

The maintenance signal generator may include a first flip-flop adapted to output the up signal in synchronization with the clock signal, a second flip-flop adapted to output the down signal in synchronization with the clock signal, a logic circuit adapted to output a signal that is activated when both of the up signal and the down signal are inactive, and a third flip-flop adapted to output an output signal of the logic circuit as the maintenance signal in synchronization with the clock signal.

Each of the bit storing stages may include three input terminals including an up terminal, a down terminal, and a maintenance terminal, an output terminal, a signal selector adapted to output a signal input to the up terminal when the up signal is active, adapted to output a signal input to the down terminal when the down signal is active, and adapted to output a signal input to the maintenance terminal when both the up signal and the down signal are inactive, and a flip-flop adapted to output an output signal of the signal selector to the output terminal in synchronization with the clock signal, wherein an output terminal of a first bit storing stage may be connected to the maintenance terminal of the first bit storing stage, the up terminal of the second bit storing stage, and the down terminal of a n(th) bit storing stage through a first inverter, wherein the output terminal of a k(th) bit storing stage, where k is an integer greater than 1 and smaller than n, may be connected to the maintenance terminal of the k(th) bit storing stage, the down terminal of the k−1(th) bit storing stage, and the up terminal of the k+1(th) bit storing stage, and wherein the output terminal of the n(th) bit storing stage may be connected to a maintenance terminal of the n(th) bit storing stage, the down terminal of the n−1(th) bit storing stage, and the up terminal of a first bit storing stage through a second inverter.

The signal selector may include a first switch coupled between the up terminal and the output terminal, and adapted to be controlled by the up signal, a second switch coupled between the down terminal and the output terminal, and adapted to be controlled by the down signal, and a third switch coupled between the maintenance terminal and the output terminal, and adapted to be controlled by the maintenance signal that is generated based on the up signal and the down signal.

At least one of the above and other features and advantages of the present invention may be separately realized by providing a frequency controller of a voltage controlled oscillator, including a thermometer code generator including n bit storing stages coupled to each other, where n is an integer greater than 1, and the thermometer code generator is adapted to store a thermometer code, adapted to increase the stored thermometer code by 1 in synchronization with a clock signal when an up signal is active, adapted to decrease the stored thermometer code by 1 in synchronization with the clock signal when a down signal is active, and adapted to maintain the stored thermometer code in synchronization with the clock signal when both of the up signal and the down signal are inactive, and a digital-analog converter adapted to generate a control voltage for controlling an output frequency of a voltage controlled oscillator corresponding to the thermometer code.

The digital-analog converter may include a current generator adapted to generate a current corresponding to the thermometer code, and an output part adapted to output the control voltage corresponding to the current generated by the current generator.

The current generator may include n current paths each of which turn on or off corresponding to a respective bit of the thermometer code.

At least one of the above and other features and advantages of the present invention may be separately realized by providing a frequency-locked loop, including a phase frequency detector adapted to compare a reference clock with a feedback clock that is generated by dividing a voltage controlled oscillator clock by a first division ratio, a charge pump adapted to supply a charge corresponding to an output signal of the phase frequency detector, a low pass filter adapted to receive the charge from the charge pump to output a first control voltage, a comparator adapted to compare the first control voltage with an upper limit reference voltage and a lower limit reference voltage, a sampler adapted to sample an output signal of the comparator to generate an up signal and a down signal, a thermometer code generator adapted to generate a thermometer code corresponding to the up signal and the down signal, a digital-analog converter adapted to generate a second control voltage corresponding to the thermometer code, a frequency lock detector adapted to detect whether a frequency is locked by using the feedback clock, a voltage controlled oscillator adapted to generate the voltage controlled oscillator clock corresponding to the first control voltage and the second control voltage, and a divider adapted to divide the reference clock by a second division ratio, and adapted to generate a sampling clock that is used for operating the thermometer code generator and the frequency lock detector.

The frequency lock detector may include a counter adapted to count a number of cycles of the feedback clock, a first flip-flop adapted to receive the counted number of the feedback clock, and adapted to output the counted number of the feedback clock in synchronization with the sampling clock, a second flip-flop adapted to receive an output of the first flip-flop, and adapted to output the output of the first flip-flop in synchronization with the sampling clock, and a lock decider adapted to compare the output of the first flip-flop with the output of the second flip-flop to generate a lock detection signal.

The frequency lock detector further may include a first coder adapted to convert a binary code that represents the counted number to a gray code, and a second coder adapted to convert a gray code that represents the output of the first flip-flop to a binary code, and adapted to output the binary code that represents the output of the first flip-flop to the second flip-flop and the lock decider, wherein the lock decider may compare the output of the first flip-flop with the output of the second flip-flop to generate the lock detection signal.

The lock decider may include a subtracter adapted to compare the output of the first flip-flop with the output of the second flip-flop, a two's complement calculator adapted to calculate two's complement of the output of the subtracter, a first multiplexer adapted to select one of the output of the subtracter and the output of the two's complement calculator and output the selected one, and a first comparator adapted to generate the lock detection signal that is active when a difference between the output of the first multiplexer and a predetermined value is less than a first reference value, and adapted to output the lock detection signal.

The lock decider further may include a second comparator adapted to generate the lock detection signal that is active when a difference between the output of the first multiplexer and the predetermined value is less than a second reference value that is greater than the first reference value, and adapted to output the lock detection signal, and a second multiplexer adapted to select an output signal of the second comparator in case of a locked state, and adapted to select an output signal of the first comparator in case of an unlocked state.

The lock decider may include a subtracter adapted to compare the output of the first flip-flop with the output of the second flip-flop, a third flip-flop adapted to store an output of the subtracter temporarily, and a first comparator adapted to generate the lock detection signal that is active when a difference between the output of the third flip-flop and the predetermined value is less than a first reference value, and adapted to output the lock detection signal.

The lock decider may include a second comparator adapted to generate the lock detection signal that is active when a difference between the output of the third flip-flop and the predetermined value is less than a second reference value that is greater than the first reference value, and to output the generated lock detection signal, and a multiplexer adapted to select an output signal of the second comparator in case of a locked state, and to select an output signal of the first comparator in case of an unlocked state.

The frequency-locked loop may include a duty ratio corrector adapted to correct a duty ratio of the voltage controlled oscillator clock generated by the voltage controlled oscillator. The second division ratio may be decided by an error range condition of the voltage controlled oscillator clock whose state is changed from an unlocked state to a locked state.

At least one of the above and other features and advantages of the present invention may be separately realized by providing a method of generating a thermometer code by using n bit storing stages to store a thermometer code, including receiving an up signal, a down signal, and a maintenance signal, increasing the stored thermometer code by 1 in synchronization with a clock signal when the up signal is active, decreasing the stored thermometer code by 1 in synchronization with the clock signal when the down signal is active, and maintaining the stored thermometer code in synchronization with the clock signal when the maintenance signal is active.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Figure 1:
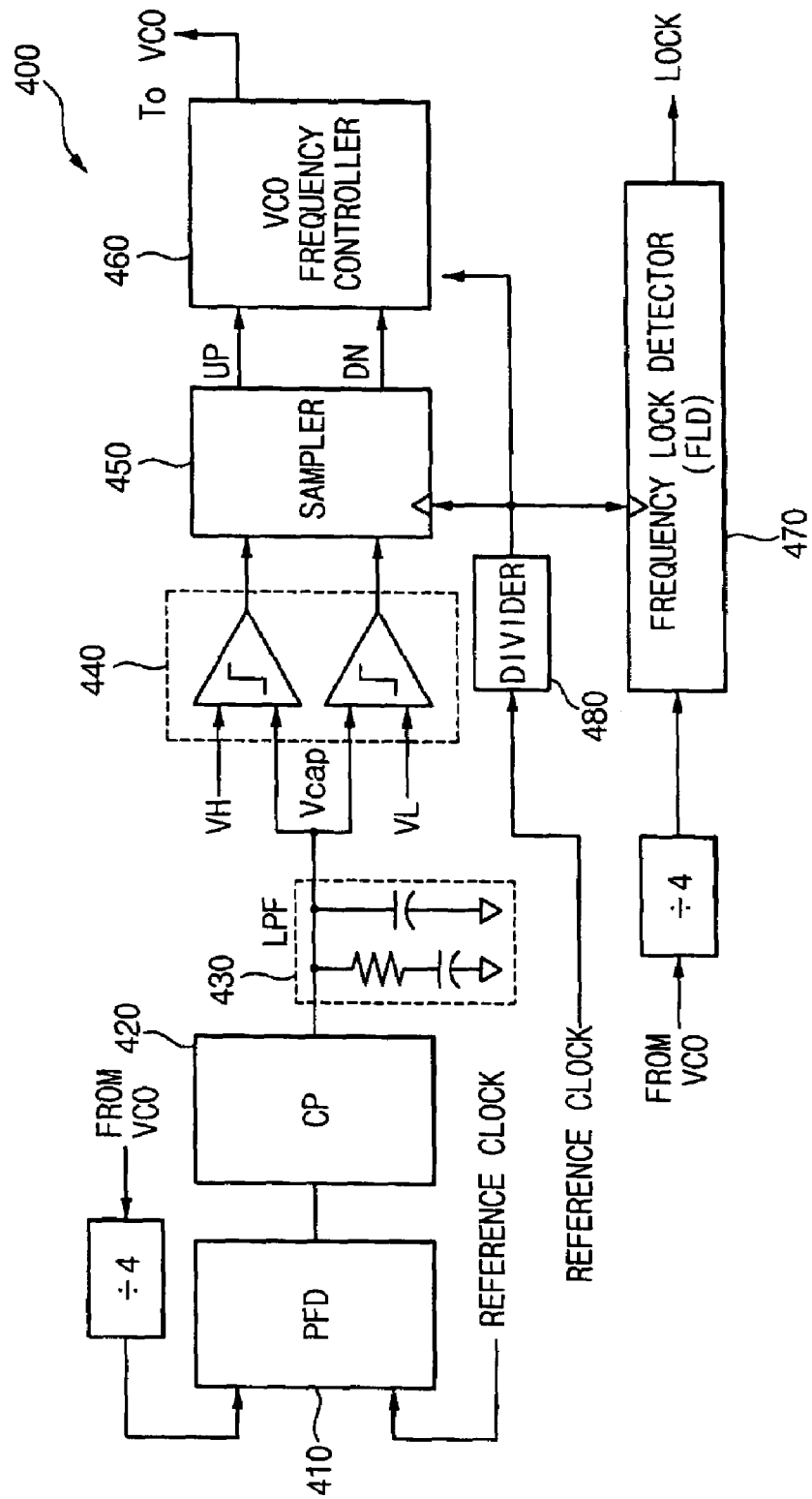
FIG. 1 illustrates a block diagram of a FLL according to an exemplary embodiment of the present invention.

Korean Patent Application No. 2006-0081395, filed on Aug. 26, 2006 in the Korean Intellectual Property Office, and entitled: "Thermometer Code Generator, and Frequency-Locked Loop Including the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these exemplary embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items. Like reference numerals refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a frequency-locked loop (FLL) 400 according to an exemplary embodiment of the present invention.

Referring to FIG. 1, the FLL 400 may lock a frequency of a VCO clock to a target frequency using coarse tuning and fine tuning. The FLL 400 may include a phase frequency detector (PFD) 410, a charge pump (CP) 420, a low pass filter (LPF) 430, a comparator 440, a sampler 450, and a VCO frequency controller 460.

The PFD 410 may compare a reference clock with a feedback clock that may be generated by dividing the VCO clock, e.g., by four (4). The CP 420 may supply a charge corresponding to an output signal of the PFD 410. The LPF 430 may receive the charge from the CP 420, and may output a first control voltage for fine tuning. A VCO (not shown) may receive the first control voltage. More particularly, e.g., the VCO may receive the charge from the CP 420 via other component(s), e.g., VCO frequency controller 460 of the FLL 400.

The CP 420 may supply a charge to increase the first control voltage when a frequency of the feedback clock is lower than a frequency of the reference clock. The CP 420 may absorb charge to decrease the first control voltage when the frequency of the feedback clock is higher than the frequency of the reference clock.

The first control voltage may increase gradually when the frequency of the feedback clock is lower than the frequency of the reference clock. When the first control voltage reaches and/or exceeds a voltage, e.g., a predetermined limit voltage, the FLL 400 may no longer be capable of increasing the frequency of the feedback clock or the frequency of the VCO clock using only fine tuning. Thus, coarse tuning may be started.

The first control voltage may decrease gradually when the frequency of the feedback clock is higher than the frequency of the reference clock. When the first control voltage reaches and/or exceeds a voltage, e.g., a predetermined limit voltage, the FLL 400 may no longer be capable of decreasing the frequency of the feedback clock or the frequency of the VCO clock using only fine tuning. Thus, coarse tuning may be started.

The comparator 440 may compare the first control voltage with an upper limit voltage VH, and output a first comparison signal. The comparator 440 may also compare the first control voltage with a lower limit voltage VL, and output a second comparison signal. The sampler 450 may sample the first comparison signal and/or the second comparison signal, and may generate an up signal UP and/or a down signal DN, respectively. The up signal UP may be activated when the first control voltage is higher than the upper limit voltage VH. The down signal DN may be activated when the first control voltage is lower than the lower limit voltage VL. Both the up signal UP and the down signal DN may be deactivated when the first control voltage is between the upper limit voltage VH and the lower limit voltage VL.

The VCO frequency controller 460 may generate a second control voltage for coarse tuning based on the up signal UP and the down signal DN.

The FLL 400 may also include a frequency lock detector (FLD) 470 that decides whether the VCO clock is locked, and a divider 480 that divides the reference clock in order to provide a clock for operating the FLD 470.

The divider 480 may generate a sampling clock by dividing the reference clock. The sampling clock may be used for operating the sampler 450, the VCO frequency controller 460, and the FLD 470. A division ratio may be decided by an error range condition of the VCO clock whose state may be changed from an unlocked state to a locked state.

The FLD 470 may receive the feedback clock from the VCO, and may generate a lock detection signal LOCK. When the lock detection signal LOCK is active, coarse tuning may be stopped. When the lock detection signal LOCK is inactive, the coarse tuning may be started again.

Figure 2:
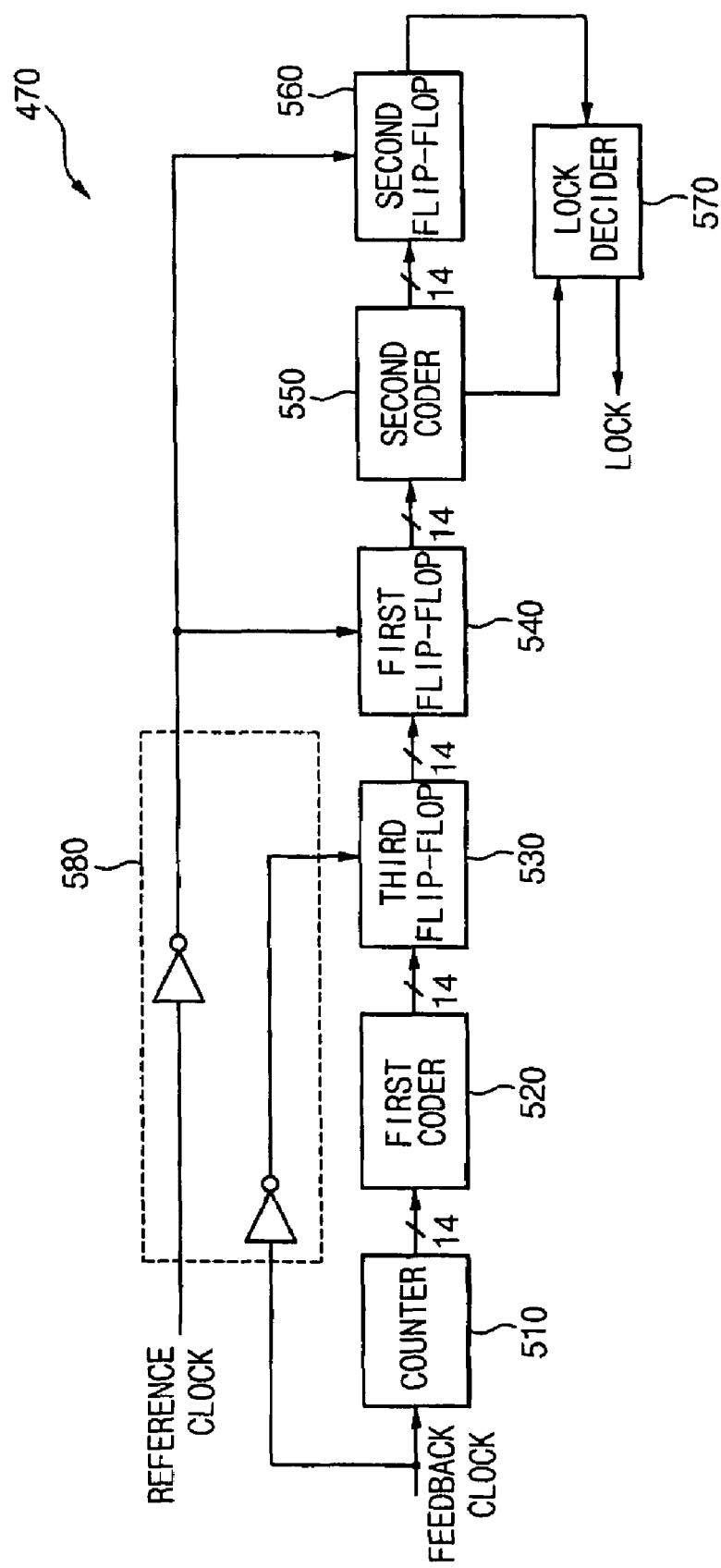
FIG. 2 illustrates a diagram of an exemplary frequency lock detector according to an exemplary embodiment of the present invention and employable by the FLL shown in FIG. 1.

FIG. 2 illustrates a diagram of an exemplary frequency lock detector (FLD) 470 according to an exemplary embodiment of the present invention and which is employable by the FLL shown in FIG. 1.

The FLD 470 may include a counter 510, a first flip-flop 540, a second flip-flop 560, and a lock decider 570. In some embodiments of the FLD 470 according to one or more aspects of the invention, the FLD 470 may also include a buffer stage 580, a first coder 520, a third flip-flop 530, and a second coder 550, which may improve an efficiency of the FLD 470. Embodiments of the FLD 470 are not limited thereto, e.g., in some embodiments, the buffer stage 580, the first coder 520, the third flip-flop 530, and the second coder 550 may be omitted. Thus, the FLD 470 without the first coder 520, the third flip-flop 530, and the second coder 550 will be described first.

The counter 510 may count a number of cycles of a feedback clock. The first flip-flop 540 may receive the counted number of the feedback clock, and may output the counted number in synchronization with a sampling clock. The second flip-flop 560 may receive an output of the first flip-flop 540, and may output the counted number in synchronization with the sampling clock. The counted number stored in the second flip-flop 560 may correspond to a number of cycles of the feedback clock during one sampling clock cycle greater than the counted number stored in the first flip-flop 540.

When the feedback clock is locked to the reference clock, the counted number stored in the first flip-flop 540 and the counted number stored in the second flip-flop 560 may converge to some number. The lock decider 570 may compare the counted number stored in the first flip-flop 540 with the counted number stored in the second flip-flop 560, and decide whether a VCO clock is locked.

An error may occur in the first flip-flop 540 as a result of, e.g., noise, etc. Less error may be generated in a gray code than in a binary code. Thus, in order to reduce the error, the FLD 470 of FIG. 2 may further include the first coder 520 that converts a binary code representing the counted number to a gray code, the third flip-flop 530 that outputs an output of the first coder 520 in synchronization with the feedback clock, and the second coder 550 that converts a gray code representing the output of the first flip-flop 540 to a binary code.

The lock decider 570 may compare an output of the second coder 550 with an output of the second flip-flop 560, and may generate a lock detection signal.

The buffer stage 580 may be used for reducing and/or eliminating pan-out problems that may occur when outputting the sampling clock and the feedback clock to the flop-flops.

Figure 3:
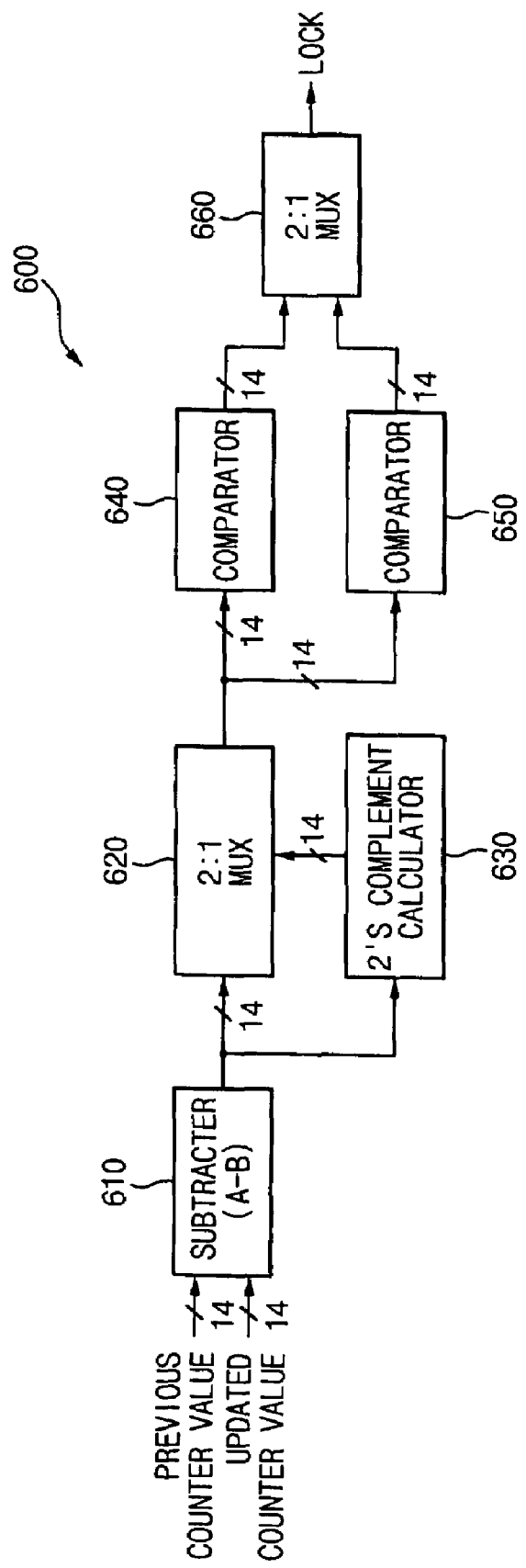
FIG. 3 illustrates a diagram of an exemplary lock decider according to an exemplary embodiment of the present invention and employable by the frequency lock detector shown in FIG. 2.

FIG. 3 illustrates a diagram of an exemplary lock decider 600 according to an exemplary embodiment of the present invention and employable by the frequency lock detector shown in FIG. 2. The exemplary lock decider 600 illustrated in FIG. 3 may be employed for the lock decider 570 shown in FIG. 2.

The lock decider 600 may include a subtracter 610, multiplexers 620 and 660, a two's complement calculator 630, and comparators 640 and 650. The subtracter 610 may compare a previous counter value with an updated counter value. The two's complement calculator 630 may calculate a two's complement of an output of the subtracter 610. The multiplexer 620 may select one among an output of the subtracter 610 and an output of the two's complement calculator 630, and may output the selected one. The comparator 640 may compare a first reference value with a difference between an output of the multiplexer 620 and a predetermined value. The comparator 650 may compare a second reference value, which may be higher than the first reference value, with a difference between the output of the multiplexer 620 and a predetermined value. The multiplexer 660 may select one among an output of the comparator 640 and an output of the comparator 650, and may output the selected one.

For example, if a frequency of a reference clock is $2^{29}$ and a frequency of a feedback clock is equal to the frequency of the reference clock, the counted number during one sampling clock section is $2^{29}/2^{14}=2^{15}(=32768)$. That is, an output of the subtracter 610 is 32768. If the frequency of the feedback clock is not equal to the frequency of the reference clock, e.g., $2^{29}$, the counted number during one sampling clock section is different from 32768. In such cases, e.g., if a lock-condition is such that the frequency error is equal to or within about 0.02%, a difference between the output of the subtracter and 32768 should be within a range of about 32768*0.02%, i.e., +/−6.6. Therefore, if an output of the multiplexer 620 is equal to or between 32762 and 32774, the lock decider 600 may decide that the VCO clock is locked.

A condition of deciding whether the VCO clock is changed from an unlocked state to a locked state may be harder to satisfy than a condition of deciding whether the VCO clock state is changed from a locked state to an unlocked state. The comparator 640 may decide whether the VCO clock state is changed from an unlocked state to a locked state, and the comparator 650 may decide whether the VCO clock state is changed from a locked state to an unlocked state. The multiplexer 660 may select the output of the comparator 650 when the VCO clock is locked, and may select the output of the comparator 640 when the VCO clock is unlocked.

The lock decider 600 of FIG. 3 may employ the two's complement calculator 630 and the multiplexer 620 to recount a counted number stored in the second flip-flop 560 of FIG. 2 when the stored counted number exceeds a maximum number.

Figure 4:
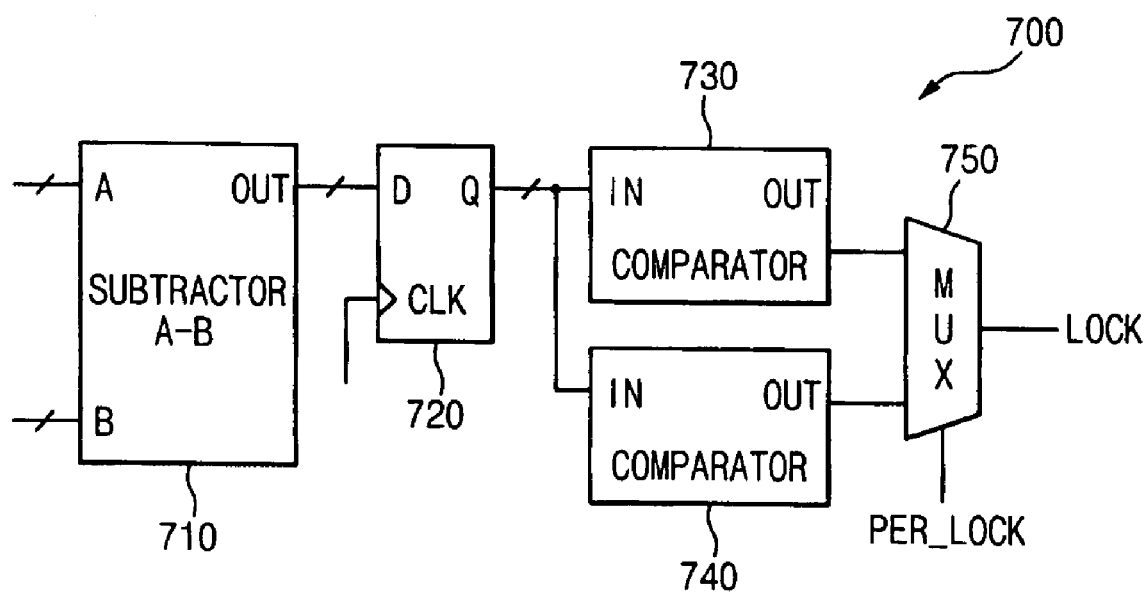
FIG. 4 illustrates a diagram of another exemplary lock decider according to an exemplary embodiment of the present invention and employable by the frequency lock detector shown in FIG. 2.

FIG. 4 illustrates a diagram of another exemplary lock decider 700 according to an exemplary embodiment of the present invention and employable by the frequency lock detector shown in FIG. 2. The exemplary lock decider 700 illustrated in FIG. 4 may be employed for the lock decider 570 shown in FIG. 2.

The lock decider 700 may include a subtracter 710, a flip-flop 720, comparators 730 and 740, and a multiplexer 750. The subtracter 710 may compare a previous counter value with an updated counter value. The flip-flop 720 may temporarily store an output value of the subtracter 710. The comparator 730 may compare a first reference value with a difference between an output value of the flip-flop 720 and a predetermined value. The comparator 740 may compare a second reference value that is higher than the first reference value with a difference between the output value of the flip-flop 720 and the predetermined value. The multiplexer 750 may select one among an output of the comparator 730 and an output of the comparator 740, and may output the selected one. Each of the comparators 730 and 740 may operate similar to each of the comparators 640 and 650 of FIG. 3, respectively, and the multiplexer 750 may operate similar to the multiplexer 660 of FIG. 3. Thus, a description of the comparators 730 and 740, and the multiplexer 750 will be omitted.

Figure 5:
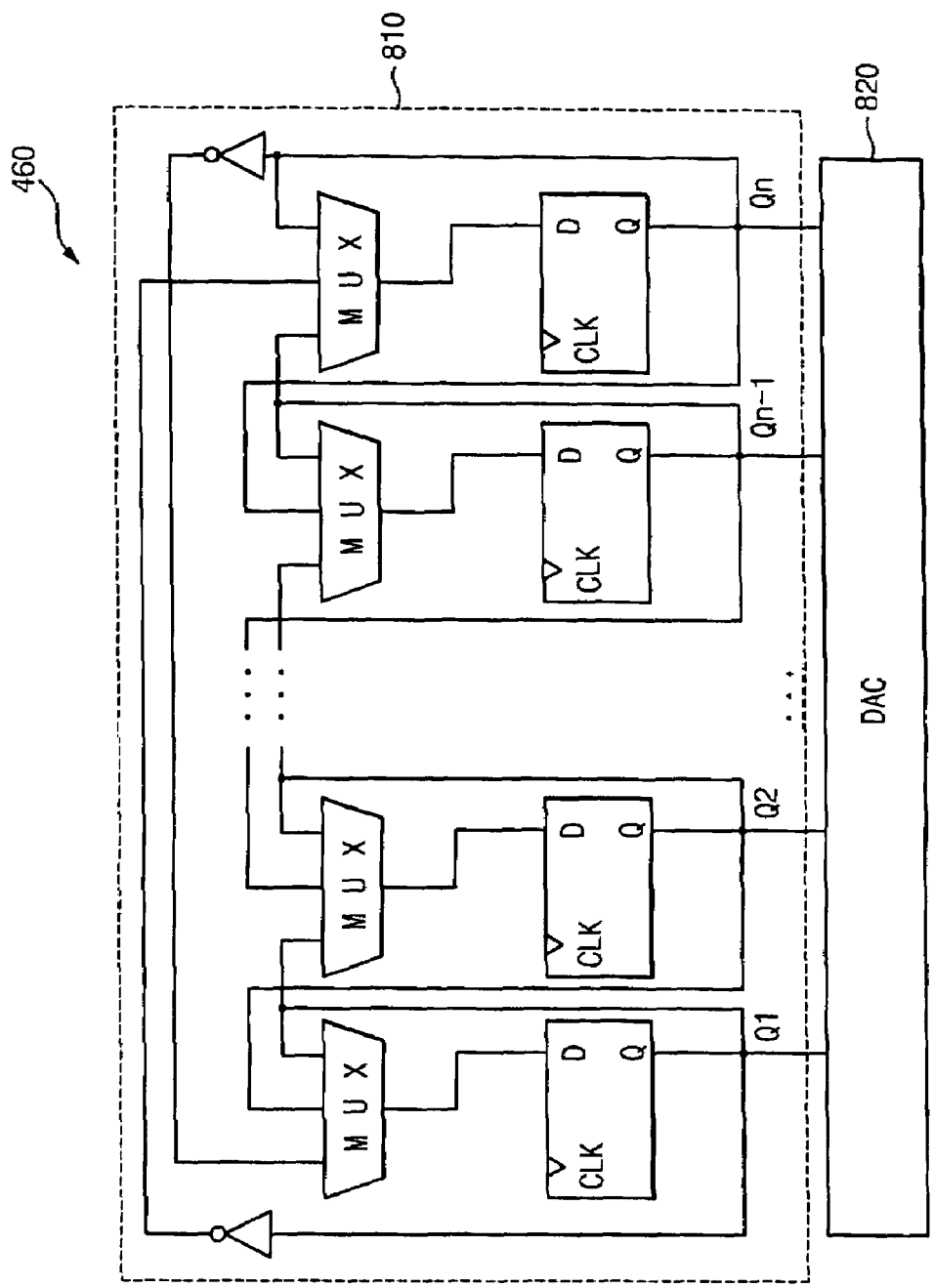
FIG. 5 illustrates a diagram of an exemplary VCO frequency controller according to an exemplary embodiment of the present invention and employable by the FLL shown in FIG. 1.

FIG. 5 illustrates a diagram of an exemplary VCO frequency controller according to an exemplary embodiment of the present invention and which is employable by the FLL shown in FIG. 1.

The VCO frequency controller 460 may include a thermometer code generator 810 that generates a thermometer code based on an up signal UP and a down signal DN, and a digital-analog converter (DAC) 820 that controls an output frequency of the VCO corresponding to the thermometer code.

An operation of the thermometer code generator 810 will be described referring to FIG. 6.

Figure 6:
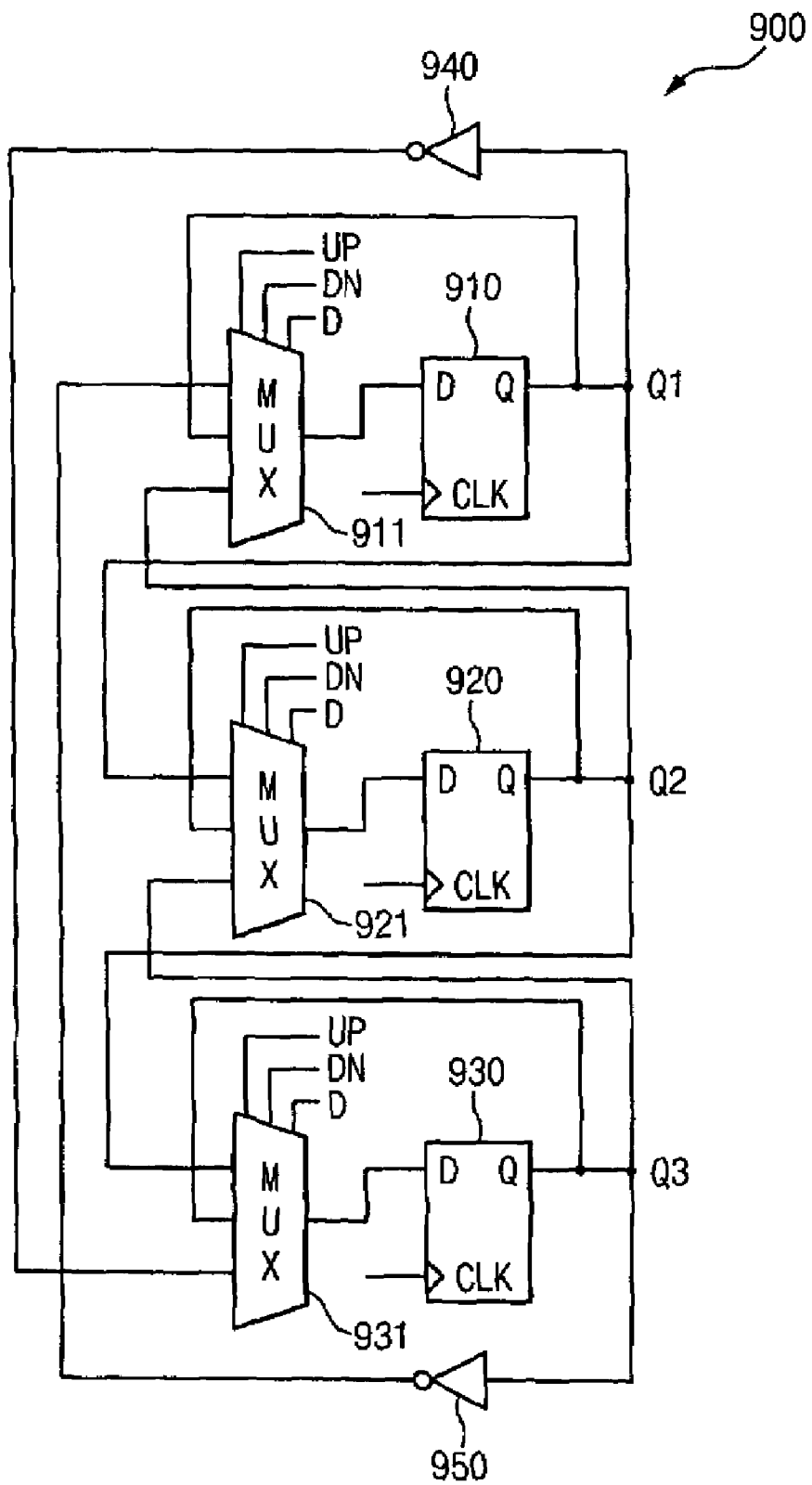
FIG. 6 illustrates a diagram of an exemplary 3-bit thermometer code generator according to an exemplary embodiment of the present invention.

FIG. 6 illustrates a diagram of an exemplary three bit thermometer code generator 900 according to an exemplary embodiment of the present invention. While the exemplary thermometer code generator 900 shown in FIG. 6 is a three bit thermometer code generator, aspects thereof may be employed to provide an n bit thermometer code generator employable as the thermometer code generator 810 of FIG. 5.

The thermometer code generator 900 may include n, e.g., three, bit storing stages. Each of the storing stages may include a flip flop and a multiplexer. For example, the first bit storing stage may include a first flip-flop 910 and a first multiplexer 911. The second bit storing stage may include a second flip-flop 920 and a second multiplexer 921. The third bit storing stage may include a third flip-flop 930 and a third multiplexer 931. Each of the bit storing stages may include, e.g., three input terminals (an up terminal, a down terminal, and a maintenance terminal) and one output terminal, and may receive a plurality of signals, e.g., the up signal UP, the down signal DN and a maintenance signal D.

Each of the multiplexers 911, 921, and 931 may select a signal that is input to the up terminal when the up signal UP is active, and may output the selected signal. Each of the multiplexers 911, 921, and 931 may select a signal that is input to the down terminal when the down signal DN is active, and may output the selected signal. Each of the multiplexers 911, 921, and 931 may select a signal that is input to the maintenance terminal when the maintenance signal D is active, and may output the selected signal. The respective selected signal UP, DN, D may be output as Q at the corresponding output terminal, i.e., the respective selected signal may be output as Q1 at the output terminal of the first bit storing stage, the respective selected signal may be output as Q2 at the output terminal of the second bit storing stage, and the respective selected signal may be output as Q3 at the output terminal of the third bit storing stage.

An exemplary connection among the bit storing stages will be described hereinafter.

An output terminal of the first bit storing stage may be connected to the maintenance terminal of the first bit storing stage and the up terminal of the second bit storing stage. The output terminal of the first bit storing stage may be connected to the down terminal of the third bit storing stage through a first inverter 940.

An output terminal of the second bit storing stage may be connected to the maintenance terminal of the second bit storing stage, the up terminal of the third bit storing stage, and the down terminal of the first bit storing stage.

An output terminal of the third bit storing stage may be connected to the maintenance terminal of the third bit storing stage and the down terminal of the second bit storing stage. The output terminal of the third bit storing stage may be connected to the up terminal of the first bit storing stage through a second inverter 950.

A case where the up signal UP is input to the exemplary thermometer code generator 900 will be described.

When a thermometer code Q1Q2Q3 is '000' initially, an output of the second flip-flop 920 is replaced with a value of the output signal of the first bit storing stage Q1 in synchronization with a clock, an output of the third flip-flop 930 is replaced with a value of the output signal of the second bit storing stage Q2 in synchronization with a rising edge of the clock, and an output of the first flip-flop 910 is replaced with an inversion value of the output signal of the third bit storing stage Q3. Thus, the thermometer code becomes '100'. In addition, when the rising edge of the clock is input again, the thermometer code becomes '110'. In addition, when the rising edge of the clock is input again, the thermometer code becomes '111'. When the thermometer code is '111', the up signal UP cannot be input.

A case where the down signal DN is input to the exemplary thermometer code generator 900 will be described below.

When the thermometer code Q1Q2Q3 is '111' initially, an output of the first flip-flop 910 is replaced with a value of the output signal of the second bit storing stage Q2 in synchronization with a clock, an output of the second flip-flop 920 is replaced with a value of the output signal of the third bit storing stage Q3 in synchronization with a rising edge of the clock, and an output of the third flip-flop 930 is replaced with an inversion value of the output signal of the first bit storing stage Q1. Thus, the thermometer code becomes '110'. In addition, when the rising edge of the clock is input again, the thermometer code becomes '100'. In addition, when the rising edge of the clock is input again, the thermometer code becomes '000'. When the thermometer code is '000', the down signal cannot be input.

In the exemplary embodiment of the thermometer code generator 900 illustrated in FIG. 6, when the maintenance signal is input, an initial value of the thermometer code is maintained.

Although the exemplary thermometer code generator 900 illustrated in FIG. 6 includes three (3) bit storing stages, embodiments of the invention are not limited thereto. The thermometer code generator may output a thermometer code of n bits, where n is any integer greater than one. An exemplary case in which a size of the thermometer code is n bits will be described below.

The thermometer code generator may include a first bit storing stage through an n(th) bit storing stage. An exemplary connection scheme among the bit storing stages will be described hereinafter.

An output terminal of the first bit storing stage may be connected to the maintenance terminal of the first bit storing stage and the up terminal of the second bit storing stage. The output terminal of the first bit storing stage may be connected to the down terminal of the n(th) bit storing stage through a first inverter.

An output terminal of the k(th) bit storing stage may be connected to the maintenance terminal of the k(th) bit storing stage, the down terminal of the (k−1)th bit storing stage, and the up terminal of the (k+1)th bit storing stage.

An output terminal of the n(th) bit storing stage may be connected to the maintenance terminal of the n(th) bit storing stage and the down terminal of the (n−1)th bit storing stage. The output terminal of the n(th) bit storing stage may be connected to the up terminal of the first bit storing stage through a second inverter.

The thermometer code generators 810, 900 of FIGS. 5 and 6 may receive the up signal UP, the down signal DN, and/or the maintenance signal D as control signal(s). However, the VCO frequency controller 460 in the FLL 400 of FIG. 1 may receive the up signal UP and the down signal DN as the control signal. The maintenance signal may be generated outside of the thermometer code generator 810, 900, or the maintenance signal may be generated inside of the thermometer code generator 810, 900. Exemplary maintenance signal generators 1000, 1100 will be described referring to FIGS. 7 and 8. The maintenance signal generator may be implemented outside of the thermometer code generator, or the maintenance signal generator may be implemented inside of the thermometer code generator.

Figure 7:
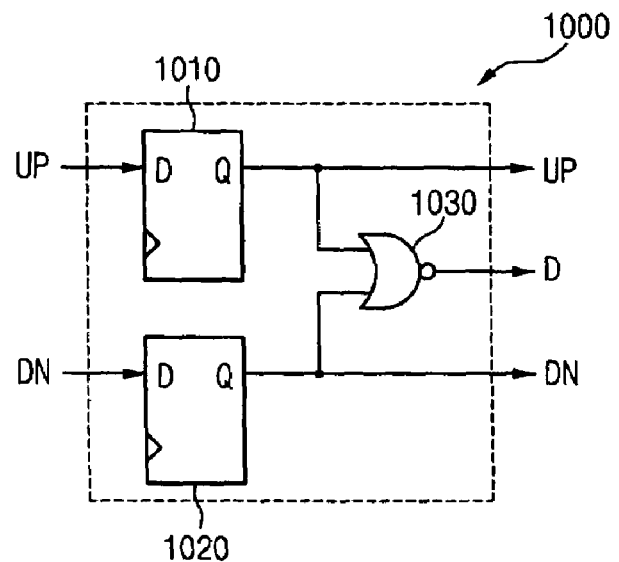
FIG. 7 illustrates a diagram of an exemplary maintenance signal generator adapted to generate the maintenance signal shown in FIG. 6 according to an exemplary embodiment of the present invention.
Figure 8:
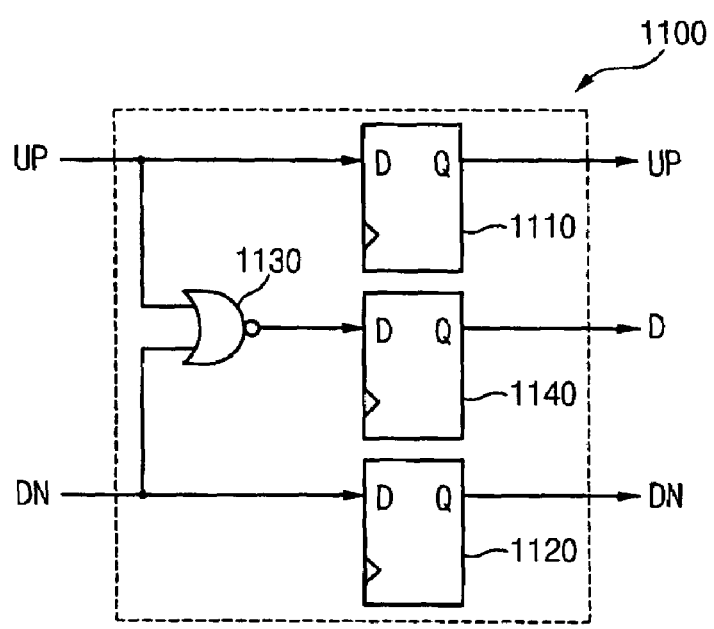
FIG. 8 illustrates a diagram of another exemplary maintenance signal generator adapted to generate the maintenance signal in FIG. 6 according to another exemplary embodiment of the invention.

FIG. 7 illustrates a diagram of an exemplary maintenance signal generator 1000 adapted to generate the maintenance signal shown in FIG. 6 according to an exemplary embodiment of the present invention, and FIG. 8 illustrates a diagram of another exemplary maintenance signal generator 1100 adapted to generate the maintenance signal in FIG. 6 according to another exemplary embodiment of the invention.

Referring to FIG. 7, the maintenance signal generator 1000 may include a first flip-flop 1010, a second flip-flop 1020, and a NOR gate 1030. The first flip-flop 1010 may receive an up signal UP, and may output the up signal UP in synchronization with a clock. The second flip-flop 1020 may receive a down signal DN, and may output the down signal DN in synchronization with the clock. The NOR gate 1030 may generate a maintenance signal D based on the up signal UP output from the first flip-flop 1010 and the down signal DN output from the second flip-flop 1020, and may output the maintenance signal D. The maintenance signal D may be active only when both of the up signal UP and the down signal DN are inactive.

Referring to FIG. 8, the maintenance signal generator 1100 may include a first flip-flop 1110, a second flip-flop 1120, a third flip-flop 1140, and a NOR gate 1130. The first flip-flop 1110 may receive an up signal UP, and may output the up signal UP in synchronization with a clock. The second flip-flop 1120 may receive a down signal DN, and may output the down signal DN in synchronization with the clock. The NOR gate 1130 may receive the up signal UP and the down signal DN, and may generate a maintenance signal D. The third flip-flop 1140 may output an output signal of the NOR gate 1130 in synchronization with the clock.

A logic circuit adapted to carry out functions of the NOR gate 1030, 1130 may be used instead of the NOR gate 1030, 1130. For example, instead of the NOR gate 1030, 1130, a logic circuit including an OR gate connected to an inverter in series may be employed.

Figure 9:
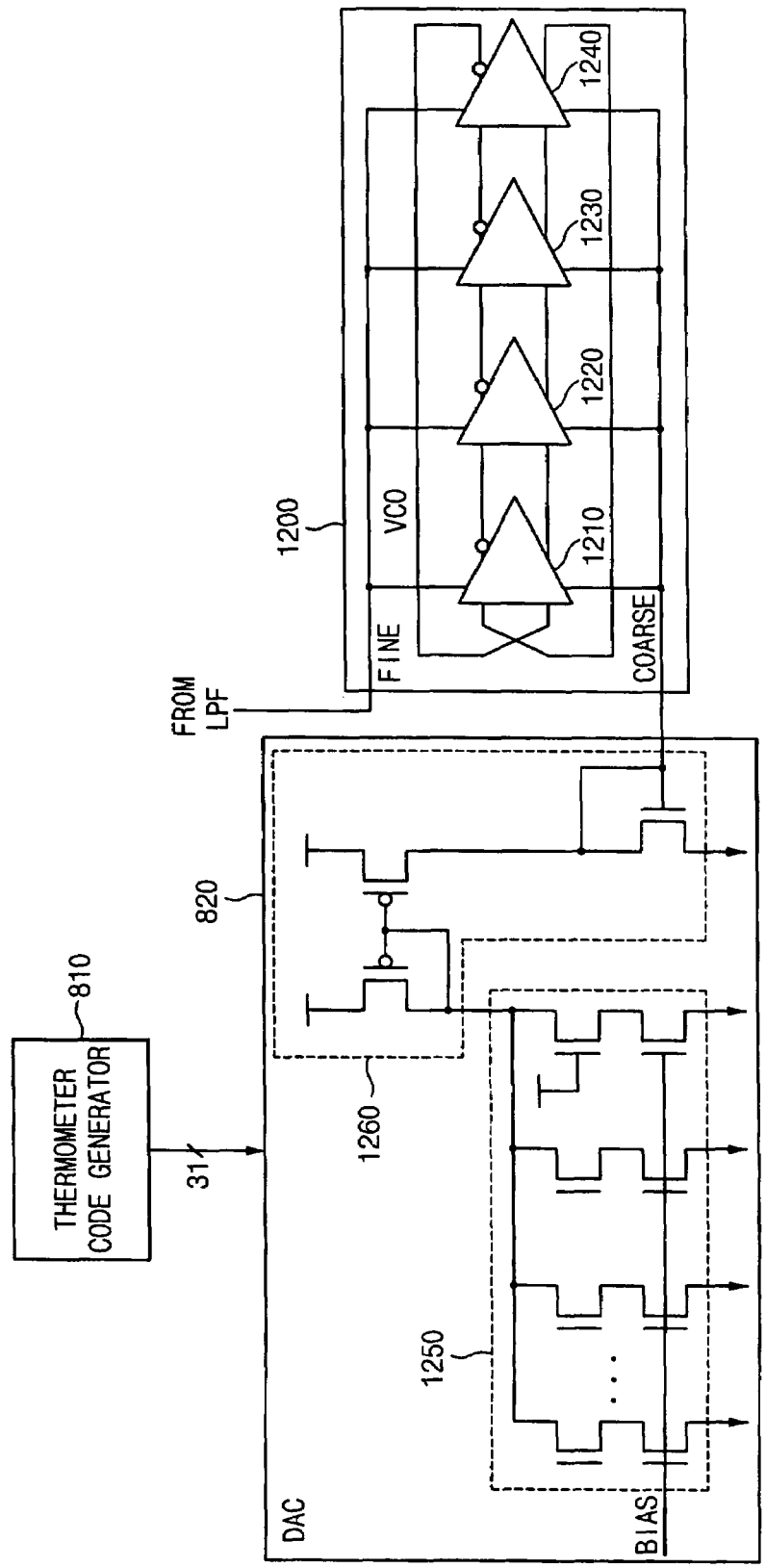
FIG. 9 illustrates a diagram of a frequency controller of a VCO and a VCO frequency controller according to an exemplary embodiment of the present invention.

FIG. 9 illustrates a diagram of a VCO 1200 connected to the VCO frequency controller 460 according to an exemplary embodiment of the present invention.

Referring to FIG. 9, the VCO frequency controller 460 including the thermometer code generator 810 and the DAC 820, as shown in FIG. 5, may be employed to control an output frequency of the VCO 1200.

The VCO 1200 may include four delay cells 1210, 1220, 1230, and 1240. A signal is inverted when the signal passes through each of the four delay cells 1210, 1220, 1230, and 1240. A VCO clock of 1 cycle may be generated when the signal passes through each of the four delay cells 1210, 1220, 1230, and 1240 two times. Thus, if each of the four delay cells 1210, 1220, 1230, and 1240 has a delay time T, the VCO 1200 may generate a VCO clock having a clock-period of 8T.

The thermometer code generated by the thermometer code generator 810 may become a second control voltage by passing through the digital-analog converter (DAC) 820. The second control voltage may be applied to a coarse tuning control terminal COARSE for coarsely tuning the VCO 1200. The first control voltage output from the LPF 430 of FIG. 1 may be applied to a fine turning control terminal FINE for fine tuning the VCO 1200.

The DAC 820 may include a current generator 1250 that generates a current corresponding to the thermometer code and an output part 1260 that outputs the second control voltage corresponding to the current.

The current generator 1250 may include n current paths that are turned on or off according to each bit of the thermometer code. For example, if the thermometer code is an 8-bit code, the current generator 1250 may include eight current paths. If the thermometer code is 11111111, all eight current paths are turned on and the generated current is maximized. Thus, under such conditions, the second control voltage is maximized. If the thermometer code is 00000000, all eight current paths may be turned off and the generated current is minimized. Thus, under such conditions, the second control voltage is minimized.

Figure 10:
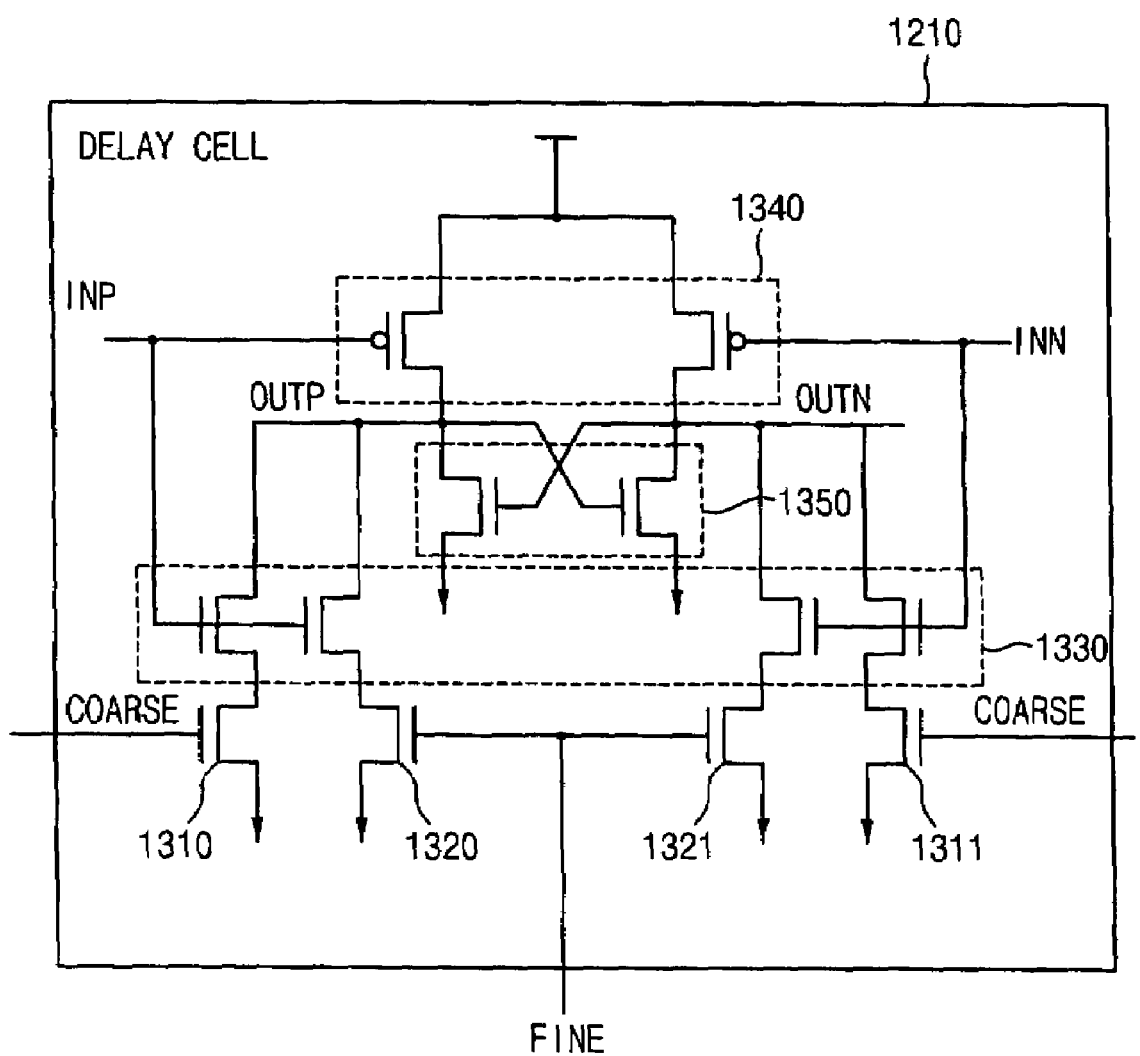
FIG. 10 illustrates a diagram of an exemplary delay cell employable by the VCO shown in FIG. 9.

FIG. 10 illustrates a diagram of an exemplary delay cell 1210 employable by the VCO 1200 shown in FIG. 9. In some embodiments of the invention, the exemplary circuit illustrated in FIG. 10 may be employed for one, some or all of the delay cell(s) of a VCO, e.g., VCO 1200.

A terminal INP and a terminal INN of the delay cell 1210 may be connected to output terminals of the delay cell 1240 of FIG. 9. A terminal OUTP and a terminal OUTN of the delay cell 1210 may be connected to input terminals of the delay cell 1220 of FIG. 9.

The second control voltage may be input to a terminal COARSE of the delay cell 1210. The first control voltage may be input to a terminal FINE of the delay cell 1210. PMOS transistors 1340 and NMOS transistors 1330 may form a differential inverter pair. The PMOS transistors 1340 and NMOS transistors 1350 may form another differential inverter pair.

When the first control voltage increases, a current that flows through the NMOS transistors 1320 and 1321 increases, and a pull-down time of the terminal OUTP or the terminal OUTN may be shortened. Similarly, when the second control voltage increases, a current that flows through the NMOS transistors 1310 and 1311 increases, and a pull-down time of the terminal OUTP or the terminal OUTN may be shortened.

A change of the current that flows through the NMOS transistors 1310 and 1311 due to the change of the second control voltage may be larger than a change of the current that flows through the NMOS transistors 1320 and 1321 due to the change of the first control voltage. Therefore, a pull-down time of the delay cell 1210 may be influenced more by the second control voltage than the first control voltage.

Figure 11:
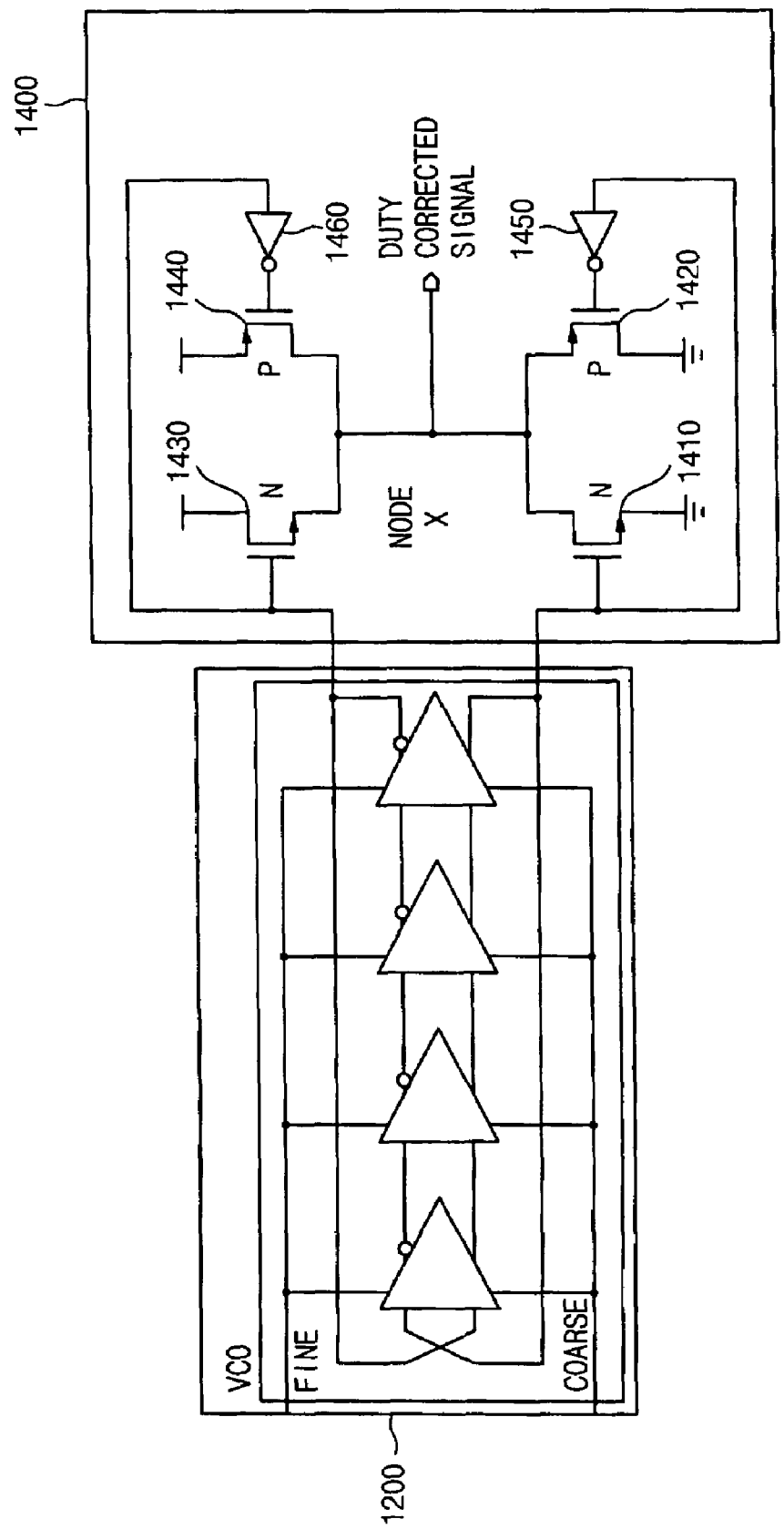
FIG. 11 illustrates a diagram of a circuit adapted to correct a duty ratio of a VCO clock outputted from the VCO shown in FIG. 9.

FIG. 11 illustrates a diagram of a circuit adapted to correct a duty ratio of a VCO clock outputted from the VCO shown in FIG. 9.

The VCO 1200 of FIG. 9 may control a delay time of delay cells by controlling a current that flows through NMOS transistors. Thus, a frequency of the VCO clock may be controlled.

The current that flows through NMOS transistors may be controlled by the first control voltage and the second control voltage, and thus, the pull-down time of each delay cell 1210, 1220, 1230, 1240 may be controlled by the first control voltage and the second control voltage. However, a pull-up time of delay bears no relation to the first control voltage and the second control voltage. Therefore, a duty ratio of the VCO 1200 of FIG. 9 and FIG. 11 may not be 50%. At a node X of a duty ratio corrector 1400, a pull-up condition may equal a pull-down condition. When receiving voltages from an output terminal pair of the VCO 1200 and controlling the voltage of the node X, the pull-up condition may equal to the pull-down condition. That is, a NMOS transistor 1410 and a PMOS transistor 1420 may be related to a pull-down of the voltage at the node X, and a NMOS transistor 1430 and a PMOS transistor 1440 may be related to a pull-up of the voltage at the node X. An inverter 1450 may be included so that both of the NMOS transistor 1410 and the PMOS transistor 1420 may be turned on or off at the same time. An inverter 1460 may be included so that both of the NMOS transistor 1430 and the PMOS transistor 1440 may be turned on or off at the same time.

As described above, since the thermometer code generator according to example embodiments of the present invention has a simple structure, the thermometer code generator can be used for implementing a high reliable frequency-locked loop.

In accordance with exemplary embodiments of the present invention, the VCO frequency controller that uses the high reliable thermometer code generator may reduce and/or prevent the voltage-controlled oscillator (VCO) from generating a VCO clock that has an unintended frequency.

In accordance with exemplary embodiments of the present invention, the frequency-locked loop that uses the high reliable thermometer code generator may efficiently lock the VCO clock to a target frequency.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A thermometer code generator, comprising:
n bit storing stages coupled to each other, where n is an integer greater than 1, and the n bit storing stages are adapted to store a thermometer code, to increase the stored thermometer code by 1 in synchronization with a clock signal when an up signal is active, to decrease the stored thermometer code by 1 in synchronization with the clock signal when a down signal is active, and to maintain the stored thermometer code in synchronization with the clock signal when both of the up signal and the down signal are inactive.

2. The thermometer code generator as claimed in claim 1, further comprising:
a maintenance signal generator adapted to generate a maintenance signal that is activated only when both of the up signal and the down signal are inactive, the thermometer code stored in the bit storing stages being maintained when the maintenance signal is active.

3. The thermometer code generator as claimed in claim 2, wherein the maintenance signal generator includes:
a first flip-flop adapted to output the up signal in synchronization with the clock signal;
a second flip-flop adapted to output the down signal in synchronization with the clock signal; and
a logic circuit adapted to receive the up signal and the down signal to output the maintenance signal.

4. The thermometer code generator as claimed in claim 3, wherein the logic circuit includes a NOR gate.

5. The thermometer code generator as claimed in claim 2, wherein the maintenance signal generator includes:
a first flip-flop adapted to output the up signal in synchronization with the clock signal;
a second flip-flop adapted to output the down signal in synchronization with the clock signal;
a logic circuit adapted to output a signal that is activated when both of the up signal and the down signal are inactive; and
a third flip-flop adapted to output an output signal of the logic circuit as the maintenance signal in synchronization with the clock signal.

6. The thermometer code generator as claimed in claim 1, wherein each of the bit storing stages includes:
three input terminals including an up terminal, a down terminal, and a maintenance terminal;
an output terminal;
a signal selector adapted to output a signal input to the up terminal when the up signal is active, adapted to output a signal input to the down terminal when the down signal is active, and adapted to output a signal input to the maintenance terminal when both the up signal and the down signal are inactive; and
a flip-flop adapted to output an output signal of the signal selector to the output terminal in synchronization with the clock signal,
wherein an output terminal of a first bit storing stage is connected to the maintenance terminal of the first bit storing stage, the up terminal of the second bit storing stage, and the down terminal of a n(th) bit storing stage through a first inverter,
wherein the output terminal of a k(th) bit storing stage, where k is an integer greater than 1 and smaller than n, is connected to the maintenance terminal of the k(th) bit storing stage, the down terminal of the k−1(th) bit storing stage, and the up terminal of the k+1(th) bit storing stage, and
wherein the output terminal of the n(th) bit storing stage is connected to a maintenance terminal of the n(th) bit storing stage, the down terminal of the n−1(th) bit storing stage, and the up terminal of a first bit storing stage through a second inverter.

7. The thermometer code generator as claimed in claim 6, wherein the signal selector includes:
   a first switch coupled between the up terminal and the output terminal, and adapted to be controlled by the up signal;
   a second switch coupled between the down terminal and the output terminal, and adapted to be controlled by the down signal; and
   a third switch coupled between the maintenance terminal and the output terminal, and adapted to be controlled by the maintenance signal that is generated based on the up signal and the down signal.

8. A frequency controller of a voltage controlled oscillator, comprising:
   a thermometer code generator including n bit storing stages coupled to each other, where n is an integer greater than 1, and the thermometer code generator is adapted to store a thermometer code, adapted to increase the stored thermometer code by 1 in synchronization with a clock signal when an up signal is active, adapted to decrease the stored thermometer code by 1 in synchronization with the clock signal when a down signal is active, and adapted to maintain the stored thermometer code in synchronization with the clock signal when both of the up signal and the down signal are inactive; and
   a digital-analog converter adapted to generate a control voltage for controlling an output frequency of a voltage controlled oscillator corresponding to the thermometer code.

9. The frequency controller as claimed in claim 8, wherein the digital-analog converter includes:
   a current generator adapted to generate a current corresponding to the thermometer code; and
   an output part adapted to output the control voltage corresponding to the current generated by the current generator.

10. The frequency controller as claimed in claim 9, wherein the current generator includes n current paths each of which turn on or off corresponding to a respective bit of the thermometer code.

11. A frequency-locked loop, comprising:
    a phase frequency detector adapted to compare a reference clock with a feedback clock that is generated by dividing a voltage controlled oscillator clock by a first division ratio;
    a charge pump adapted to supply a charge corresponding to an output signal of the phase frequency detector;
    a low pass filter adapted to receive the charge from the charge pump to output a first control voltage;
    a comparator adapted to compare the first control voltage with an upper limit reference voltage and a lower limit reference voltage;
    a sampler adapted to sample an output signal of the comparator to generate an up signal and a down signal;
    a thermometer code generator adapted to generate a thermometer code corresponding to the up signal and the down signal;
    a digital-analog converter adapted to generate a second control voltage corresponding to the thermometer code;
    a frequency lock detector adapted to detect whether a frequency is locked by using the feedback clock;
    a voltage controlled oscillator adapted to generate the voltage controlled oscillator clock corresponding to the first control voltage and the second control voltage; and
    a divider adapted to divide the reference clock by a second division ratio, and adapted to generate a sampling clock that is used for operating the thermometer code generator and the frequency lock detector.

12. The frequency-locked loop as claimed in claim 11, wherein the frequency lock detector includes:
    a counter adapted to count a number of cycles of the feedback clock;
    a first flip-flop adapted to receive the counted number of the feedback clock, and adapted to output the counted number of the feedback clock in synchronization with the sampling clock;
    a second flip-flop adapted to receive an output of the first flip-flop, and adapted to output the output of the first flip-flop in synchronization with the sampling clock; and
    a lock decider adapted to compare the output of the first flip-flop with the output of the second flip-flop to generate a lock detection signal.

13. The frequency-locked loop as claimed in claim 12, wherein the frequency lock detector further includes;
    a first coder adapted to convert a binary code that represents the counted number to a gray code; and
    a second coder adapted to convert a gray code that represents the output of the first flip-flop to a binary code, and adapted to output the binary code that represents the output of the first flip-flop to the second flip-flop and the lock decider,
    wherein the lock decider compares the output of the first flip-flop with the output of the second flip-flop to generate the lock detection signal.

14. The frequency-locked loop as claimed in claim 12, wherein the lock decider includes:
    a subtracter adapted to compare the output of the first flip-flop with the output of the second flip-flop;
    a two's complement calculator adapted to calculate two's complement of the output of the subtracter;
    a first multiplexer adapted to select one of the output of the subtracter and the output of the two's complement calculator and output the selected one; and
    a first comparator adapted to generate the lock detection signal that is active when a difference between the output of the first multiplexer and a predetermined value is less than a first reference value, and adapted to output the lock detection signal.

15. The frequency-locked loop as claimed in claim 14, wherein the lock decider further includes:
    a second comparator adapted to generate the lock detection signal that is active when a difference between the output of the first multiplexer and the predetermined value is less than a second reference value that is greater than the first reference value, and adapted to output the lock detection signal; and
    a second multiplexer adapted to select an output signal of the second comparator in case of a locked state, and adapted to select an output signal of the first comparator in case of an unlocked state.

16. The frequency-locked loop as claimed in claim 12, wherein the lock decider includes:
    a subtracter adapted to compare the output of the first flip-flop with the output of the second flip-flop;
    a third flip-flop adapted to store an output of the subtracter temporarily; and
    a first comparator adapted to generate the lock detection signal that is active when a difference between the output of the third flip-flop and the predetermined value is less than a first reference value, and adapted to output the lock detection signal.

17. The frequency-locked loop as claimed in claim 16, wherein the lock decider further includes:
- a second comparator adapted to generate the lock detection signal that is active when a difference between the output of the third flip-flop and the predetermined value is less than a second reference value that is greater than the first reference value, and adapted to output the generated lock detection signal; and
- a multiplexer adapted to select an output signal of the second comparator in case of a locked state, and adapted to select an output signal of the first comparator in case of an unlocked state.

18. The frequency-locked loop as claimed in claim 11, further comprising:
- a duty ratio corrector adapted to correct a duty ratio of the voltage controlled oscillator clock generated by the voltage controlled oscillator.

19. The frequency-locked loop as claimed in claim 11, the second division ratio is decided by an error range condition of the voltage controlled oscillator clock whose state is changed from an unlocked state to a locked state.

20. A method of generating a thermometer code by using n bit storing stages to store a thermometer code, comprising:
- receiving an up signal, a down signal, and a maintenance signal;
- increasing the stored thermometer code by 1 in synchronization with a clock signal when the up signal is active;
- decreasing the stored thermometer code by 1 in synchronization with the clock signal when the down signal is active; and
- maintaining the stored thermometer code in synchronization with the clock signal when the maintenance signal is active.

* * * * *